(12) United States Patent
Yamaguchi

(10) Patent No.: US 10,079,324 B2
(45) Date of Patent: Sep. 18, 2018

(54) SEMICONDUCTOR LIGHT-RECEIVING DEVICE

(71) Applicant: Mitsubishi Electric Corporation, Tokyo (JP)

(72) Inventor: Harunaka Yamaguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/054,841

(22) Filed: Feb. 26, 2016

(65) Prior Publication Data

US 2017/0033254 A1 Feb. 2, 2017

(30) Foreign Application Priority Data

Jul. 30, 2015 (JP) .................................. 2015-150723

(51) Int. Cl.
| | |
|---|---|
| *H01L 31/107* | (2006.01) |
| *H01L 31/0304* | (2006.01) |
| *H01L 31/0352* | (2006.01) |

(52) U.S. Cl.
CPC .... *H01L 31/1075* (2013.01); *H01L 31/03046* (2013.01); *H01L 31/035236* (2013.01); *Y02E 10/544* (2013.01)

(58) Field of Classification Search
CPC ........... H01L 31/1075; H01L 31/03046; H01L 31/035236
USPC .................. 257/21, 199, 431, 458, 466, 603
See application file for complete search history.

(56) References Cited

U.S. PATENT DOCUMENTS

| | | | | |
|---|---|---|---|---|
| 5,171,707 | A | * 12/1992 | Takahashi | .............. B82Y 20/00 |
| | | | | 148/DIG. 160 |
| 5,212,395 | A | 5/1993 | Berger et al. | |
| 5,771,256 | A | 6/1998 | Bhat | |
| 5,882,951 | A | * 3/1999 | Bhat | ..................... B82Y 20/00 |
| | | | | 148/DIG. 50 |
| 8,124,959 | B2 | * 2/2012 | Hudait | ............. H01L 21/02381 |
| | | | | 257/14 |

(Continued)

FOREIGN PATENT DOCUMENTS

| | | |
|---|---|---|
| CN | 1221520 A | 6/1999 |
| CN | 102396059 A | 3/2012 |

(Continued)

OTHER PUBLICATIONS

Masahiro Nada et al. (2012) "Inverted InAlAs/InGaAs Avalanche Photodiode with Low-High-Low Electric Field Profile" Japanese Journal of Applied Physics 51, pp. 02BG03-1-02BG03-4.

(Continued)

*Primary Examiner* — Ori Nadav
(74) *Attorney, Agent, or Firm* — Studebaker & Brackett PC

(57) ABSTRACT

A semiconductor light-receiving device includes: a semi-insulating substrate; and a buffer layer, a p-type contact layer, a light absorption layer, a p-type field alleviating layer, an avalanche multiplication layer, an n-type field alleviating layer and an n-type contact layer laminated in order on the semi-insulating substrate, wherein the buffer layer includes a superlattice obtained by alternately laminating an InP layer and an $Al_xGa_yIn_{1-x-y}As$ layer ($0.16 \leq x \leq 0.48$, $0 \leq y \leq 0.31$) and does not absorb light of a wavelength band absorbed by the light absorption layer.

2 Claims, 2 Drawing Sheets

(56) References Cited

U.S. PATENT DOCUMENTS

| | | | |
|---|---|---|---|
| 2002/0028526 A1* | 3/2002 | Kurahashi | B82Y 20/00 438/22 |
| 2002/0195609 A1* | 12/2002 | Yoshitake | H01L 33/44 257/81 |
| 2005/0189552 A1* | 9/2005 | Ikoma | B82Y 20/00 257/94 |
| 2005/0224839 A1* | 10/2005 | Yagyu | H01L 31/1075 257/199 |
| 2005/0263787 A1 | 12/2005 | Ishimura et al. | |
| 2006/0039653 A1* | 2/2006 | Painter | B82Y 20/00 385/50 |
| 2006/0071218 A1* | 4/2006 | Takeda | B82Y 10/00 257/79 |
| 2007/0120226 A1* | 5/2007 | Nakaji | H01L 31/03046 257/603 |
| 2007/0284614 A1* | 12/2007 | Adesida | H01L 29/42316 257/194 |
| 2008/0023726 A1* | 1/2008 | Adesida | H01L 21/8252 257/194 |
| 2009/0020841 A1* | 1/2009 | Hu | H01L 31/105 257/442 |
| 2009/0039453 A1 | 2/2009 | Nakata | |
| 2009/0202196 A1* | 8/2009 | Kish, Jr. | B82Y 20/00 385/14 |
| 2012/0032699 A1* | 2/2012 | Fukuhara | G01R 31/025 324/762.05 |
| 2012/0286328 A1 | 11/2012 | Nishida et al. | |
| 2013/0299936 A1* | 11/2013 | Takemura | H01L 31/107 257/458 |
| 2013/0315273 A1* | 11/2013 | Kimoto | H01S 5/4087 372/50.121 |
| 2014/0339501 A1* | 11/2014 | Bennett | H01L 29/122 257/14 |
| 2014/0353530 A1* | 12/2014 | Chang-Hasnain | H01L 31/02327 250/552 |
| 2016/0020582 A1* | 1/2016 | Ma | H01S 5/187 372/50.11 |

FOREIGN PATENT DOCUMENTS

| | | |
|---|---|---|
| CN | 103390680 A | 11/2013 |
| EP | 0863554 A2 | 9/1998 |
| JP | H06-013645 A | 1/1994 |
| JP | H07-030185 A | 1/1995 |
| JP | H08-083904 A | 3/1996 |
| JP | H10-247727 A | 9/1998 |
| JP | 2001-077204 A | 3/2001 |
| JP | 2005/340339 A | 12/2005 |
| WO | 2007/086528 A1 | 8/2007 |
| WO | 2011/089949 A1 | 7/2011 |

OTHER PUBLICATIONS

N. Otsuka et al. (1998) "Control of double diffusion front unintentionally penetrated from a Zn doped InP layer during metalorganic vapor phase epitaxy" Journal of Applied Physics vol. 84, No. 8, pp. 4239-4247.

An Office Action issued by Chinese Patent Office dated Jul. 4, 2017, which corresponds to Chinese Patent Application No. 201610617954.6 and is related to U.S. Appl. No. 15/054,841.

An Office Action issued by Chinese Patent Office dated Mar. 30, 2018, which corresponds to Chinese Patent Application No. 201610617954.6 and is related to U.S. Appl. No. 15/054,841.

\* cited by examiner

US 10,079,324 B2

SEMICONDUCTOR LIGHT-RECEIVING DEVICE

BACKGROUND OF THE INVENTION

Field of the Invention

The present invention relates to a semiconductor light-receiving device.

Background Art

High-speed response avalanche photodiodes for optical communication use AlInAs for an electron multiplication layer. Among them, avalanche photodiodes are being developed in recent years, for which a p-type contact layer, a light absorption layer, a p-type field alleviating layer, an electron multiplication layer and an n-type contact layer are made to grow in order on a semi-insulating InP substrate (e.g., see Japanese Journal of Applied Physics 51 (2012) 02BG03). Such a structure has an excellent high-speed response characteristic, but on the other hand, Fe contained in the semi-insulating InP substrate and Zn in the p-type contact layer are likely to trigger mutual diffusion, and this may adversely affect the device yield (e.g., see Journal of Applied Physics 84 (1998) 8).

Particularly when a plurality of diodes are formed, arranged side by side on a substrate, the above-described mutual diffusion between Fe and Zn makes it fail to sufficiently separate one diode from another, resulting in a problem of producing a leakage current. In order to solve this problem, an undoped InP layer may be made to grow into a thick buffer layer on an Fe-doped semi-insulating InP substrate to thereby separate the substrate from the p-type contact layer. However, in the InP buffer layer, it is not possible to suppress influences of impurity such as Si remaining in an interface between an epitaxial layer and the substrate, and it is not possible to suppress a leakage current, either. Furthermore, the growth time period of the buffer layer is extended, and this is not desirable from the standpoint of productivity such as an amount of material consumption. Moreover, incident light may be absorbed in the buffer layer, causing light-receiving sensitivity to deteriorate.

SUMMARY OF THE INVENTION

The present invention has been implemented to solve the above-described problems and it is an object of the present invention to provide a semiconductor light-receiving device capable of suppressing a leakage current and preventing light-receiving sensitivity from deteriorating.

According to the present invention, a semiconductor light-receiving device includes: a semi-insulating substrate; and a buffer layer, a p-type contact layer, a light absorption layer, a p-type field alleviating layer, an avalanche multiplication layer, an n-type field alleviating layer and an n-type contact layer laminated in order on the semi-insulating substrate, wherein the buffer layer includes a superlattice obtained by alternately laminating an InP layer and an $Al_xGa_yIn_{1-x-y}As$ layer ($0.16 \le x \le 0.48$, $0 \le y \le 0.31$) and does not absorb light of a wavelength band absorbed by the light absorption layer.

In the present invention, the buffer layer includes a superlattice obtained by alternately laminating an InP layer and an $Al_xGa_yIn_{1-x-y}As$ layer ($0.16 \le x \le 0.48$, $0 \le y \le 0.31$) and does not absorb light of a wavelength band absorbed by the light absorption layer. This makes it possible to suppress a leakage current and prevent a decrease in light-receiving sensitivity.

Other and further objects, features and advantages of the invention will appear more fully from the following description.

DETAILED DESCRIPTION OF THE PREFERRED EMBODIMENTS

Figure 1:
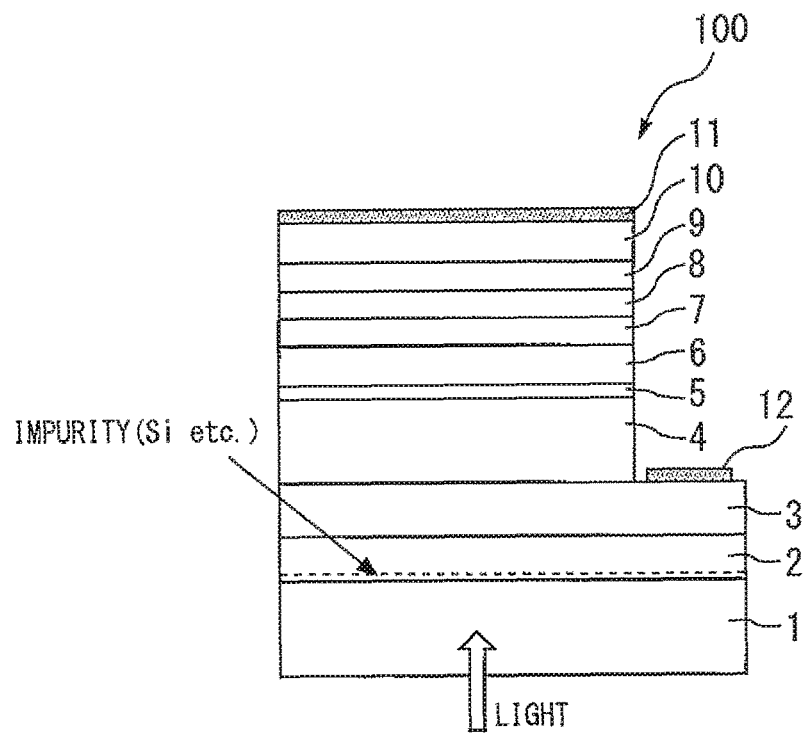
FIG. 1 is a cross-sectional view illustrating a semiconductor light-receiving device according to an embodiment of the present invention.

FIG. 1 is a cross-sectional view illustrating a semiconductor light-receiving device according to an embodiment of the present invention. This semiconductor light-receiving device is an electron multiplication type avalanche photodiode 100.

A buffer layer 2, a p-type InGaAs contact layer 3, an $n^-$-type InGaAs light absorption layer 4, an if-type AlGaInAs transition layer 5, a p-type AlInAs field alleviating layer 6, an undoped AlInAs avalanche multiplication layer 7, an if-type AlInAs field alleviating layer 8, an $n^-$-type InP window layer 9 and an n-type InGaAs contact layer 10 are laminated in order on an Fe-doped semi-insulating InP substrate 1. An n-electrode 11 is formed on the n-type InGaAs contact layer 10. A crystal layer located on part of the P-type InGaAs contact layer 3 is removed and a p-electrode 12 is formed on part of the p-type InGaAs contact layer 3.

Next, operation of the semiconductor light-receiving device according to the present embodiment will be described. With a reverse bias voltage added from outside so that the n-electrode 11 side becomes "+" and the p-electrode 12 side becomes "−," light to be detected is made incident on the semiconductor light-receiving device from the back side of the Fe-doped semi-insulating InP substrate 1. Here, when light in a near-infrared region of a 1.3 μm band or 1.5 μm band which is an optical communication wavelength band is made incident, the light is absorbed in the $n^-$-type InGaAs light absorption layer 4, electron-hole pairs are generated, electrons move to the n-electrode 11 side and holes move to the p-electrode 12 side. When the reverse bias voltage is sufficiently high, electrons in the undoped AlInAs avalanche multiplication layer 7 are ionized, new electron-hole pairs are generated, triggering further ionization together with the newly generated electrons and holes. This provokes avalanche multiplication, a phenomenon in which electrons and holes are multiplied like an avalanche.

Figure 2:
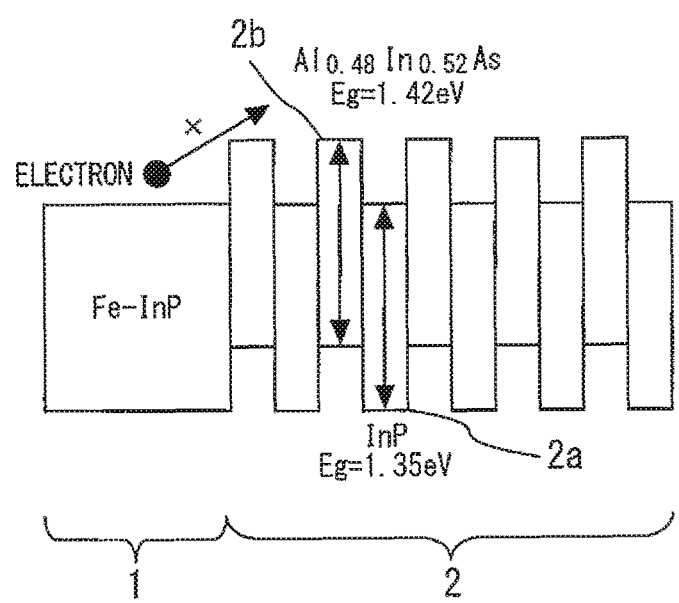
FIG. 2 is a diagram illustrating band energy of the substrate and the buffer layer of the semiconductor light-receiving device according to the embodiment of the present invention.

FIG. 2 is a diagram illustrating band energy of the substrate and the buffer layer of the semiconductor light-receiving device according to the embodiment of the present invention. The buffer layer 2 according to the present embodiment is a superlattice obtained by alternately laminating an InP layer 2a and an $Al_{0.18}In_{0.52}As$ layer 2b ten times repeatedly. Band gap energy Eg of InP is 1.35 eV and band gap energy Eg of $Al_{0.48}In_{0.52}As$ is 1.42 eV. When InP and AlInAs are heterojunctioned, an energy difference ΔEc of a conduction band becomes 0.24 eV and an energy difference ΔEv of a valence band becomes −0.17 eV.

Next, a method of manufacturing the semiconductor light-receiving device according to the present embodiment will be described. Examples of a method of making grow each semiconductor layer include metal organic vapor phase epitaxy (MOVPE) or molecular beam epitaxy (MBE). Here, the MOVPE method will be adopted and suppose a growth temperature is on the order of 600° C. Note that if the growth temperature of each semiconductor layer is between 600 and 630° C., a desired crystal layer can be made to grow.

First, the undoped InP layer 2a having a thickness of 0.02 to 0.05 μm and the undoped AlInAs layer 2b having a thickness of 0.02 to 0.05 μm are alternately made to grow on the Fe-doped semi-insulating InP substrate 1 ten times repeatedly to form the buffer layer 2 having a thickness of 0.4 to 1.0 μm.

Next, the p-type InGaAs contact layer 3 having a carrier concentration of 1.0 to $5 \times 10^{18}$ cm$^{-3}$ and a thickness of 0.1 to 0.5 μm is formed. Next, the n$^-$-type InGaAs light absorption layer 4 having a carrier concentration of 1 to $5 \times 10^{15}$ cm$^{-3}$ and a thickness of 1 to 2 μm is formed. Next, the n$^-$-type AlGaInAs transition layer 5 having a carrier concentration of 1 to $5 \times 10^{15}$ cm$^{-3}$ and a thickness of 0.01 to 0.05 μm is formed. Next, the carbon-doped p-type AlInAs field alleviating layer 6 having a carrier concentration of 0.5 to $1 \times 10^{18}$ cm$^{-3}$ and a thickness of 0.05 to 0.15 μm is formed. Next, the undoped AlInAs avalanche multiplication layer 7 having a thickness of 0.05 to 0.1 μm is formed. Next, the n$^-$-type AlInAs field alleviating layer 8 having a carrier concentration of 1 to $5 \times 10^{16}$ cm$^{-3}$ and a thickness of 0.1 to 0.3 μm is formed. Next, the n$^-$-type InP window layer 9 having a carrier concentration of 1 to $5 \times 10^{16}$ cm$^{-3}$ and a thickness of 0.1 to 0.5 μm is formed. Next, the n-type InGaAs contact layer 10 having a carrier concentration of 1 to $5 \times 10^{18}$ cm$^{-3}$ and a thickness of 0.3 to 0.6 μm is formed.

Next, using an SiOx film from which a circle having a diameter of approximately 20 μm is hollowed out as a mask, the n-electrode 11 is formed of AuGeNi only on the n-type InGaAs contact layer 10. Next, the SiOx film on the p-type InGaAs contact layer 3 is removed. Next, the crystal layer located on part of the p-type InGaAs contact layer 3 is removed using a technique such as reactive ion etching and the p-electrode 12 is formed of AuZn or the like on the part of the p-type InGaAs contact layer 3. Finally, the back side of the Fe-doped semi-insulating InP substrate 1, that is, the surface opposite to the surface on which the buffer layer 2 is laminated is polished. The semiconductor light-receiving device according to the present embodiment is manufactured through the above-described steps.

As described above, the buffer layer 2 according to the present embodiment is a superlattice obtained by alternately laminating the InP layer 2a and the $Al_{0.48}In_{0.52}As$ layer 2b ten times repeatedly. The energy difference ΔEc in the conduction band between the InP layer 2a and the $Al_{0.48}In_{0.52}As$ layer 2b becomes a barrier to electrons. According to the present embodiment, it is further possible to earn the conduction band energy difference ΔEc through the superlattice on which the InP layer 2a and the $Al_{0.48}In_{0.52}As$ layer 2b are alternately laminated, and thereby suppress a leakage current.

Since the buffer layer 2 according to the present embodiment suppresses a leakage current using an energy difference by heterojunction, the film thickness need not be increased compared to the buffer layer with an InP single layer. Therefore, the growth time period of the buffer layer 2 becomes shorter and the material cost also decreases, which is preferable from the standpoint of productivity. Furthermore, since there is lattice match between AlInAs and InP, crystal growth is also easy.

Moreover, since the band gap of AlInAs is sufficiently larger than energy of incident light used for optical communication, the buffer layer 2 does not absorb light of a wavelength band absorbed by the n$^-$-type InGaAs light absorption layer 4. Therefore, it is possible to prevent a decrease in light-receiving sensitivity caused by light absorption in the buffer layer 2.

Figure 3:
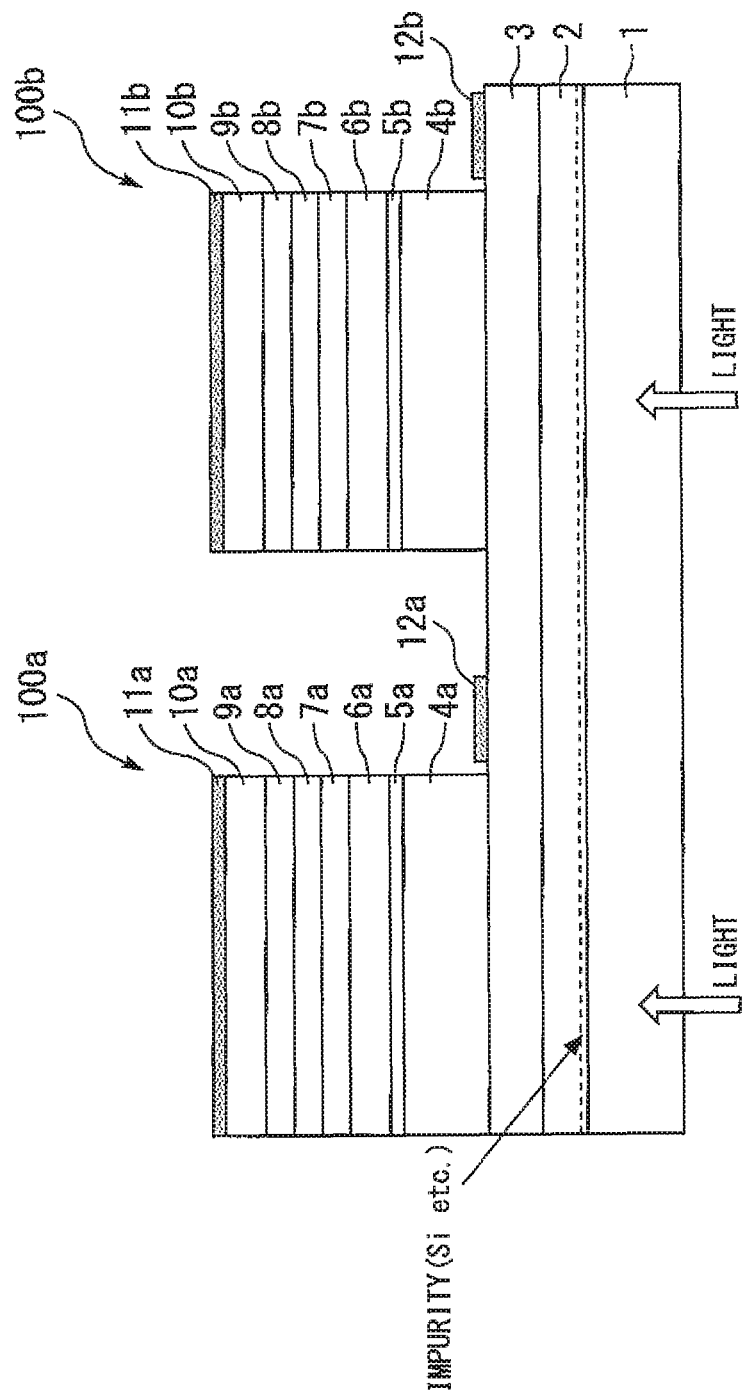
FIG. 3 is a cross-sectional view illustrating a modification of the semiconductor light-receiving device according to the embodiment of the present invention.

FIG. 3 is a cross-sectional view illustrating a modification of the semiconductor light-receiving device according to the embodiment of the present invention. In this example, first and second avalanche photodiodes 100a and 100b are formed, arranged side by side on the same Fe-doped semi-insulating InP substrate 1.

More specifically, n$^-$-type InGaAs light absorption layers 4a and 4b are formed separate from each other on a p-type contact layer. An n$^-$-type AlGaInAs transition layer 5a, a p-type AlInAs field alleviating layer 6a, an undoped AlInAs avalanche multiplication layer 7a, an n$^-$-type AlInAs field alleviating layer 8a, an n$^-$-type InP window layer 9a and an n-type InGaAs contact layer 10a are formed in order on the n$^-$-type InGaAs light absorption layer 4a. An n$^-$-type AlGaInAs transition layer 5b, a p-type AlInAs field alleviating layer 6b, an undoped AlInAs avalanche multiplication layer 7b, an n$^-$-type AlInAs field alleviating layer 8b, an n$^-$-type InP window layer 9b and an n-type InGaAs contact layer 10b are formed in order on the n$^-$-type InGaAs light absorption layer 4b. Respective n-electrodes 11a and 11b are formed on the n-type InGaAs contact layers 10a and 10b and p-electrodes 12a and 12b are formed on parts of the p-type InGaAs contact layer 3 from which the crystal layers located thereon are removed.

The n$^-$-type InGaAs light absorption layer 4a, the n$^-$-type AlGaInAs transition layer 5a, the p-type AlInAs field alleviating layer 6a, the undoped AlInAs avalanche multiplication layer 7a, the n$^-$-type AlInAs field alleviating layer 8a, the n$^-$-type InP window layer 9a and the n-type InGaAs contact layer 10a constitute the first avalanche photodiode 100a. The n$^-$-type InGaAs light absorption layer 4b, the n$^-$-type AlGaInAs transition layer 5b, the p-type AlInAs field alleviating layer 6b, the undoped AlInAs avalanche multiplication layer 7b, the n$^-$-type AlInAs field alleviating layer 8b, the n$^-$-type InP window layer 9b and the n-type InGaAs contact layer 10b constitute the second avalanche photodiode 100b.

Here, as the response speed increases, not a single diode but a plurality of diodes need to be formed, arranged side by side. In the conventional configurations, it is not possible to sufficiently separate one diode from another due to influences of impurity remaining in the substrate interface, resulting in a problem with a leakage current. In contrast, the present embodiment uses a superlattice obtained by alternately laminating the InP layer 2a and an $Al_xGa_yIn_{1-x-y}As$ layer as the buffer layer 2. This makes it possible to reduce influence of the impurity remaining in the substrate interface and suppress a leakage current.

Note that in the present embodiment, the buffer layer 2 is a superlattice containing $Al_{0.48}In_{0.52}As$ layer 2b, but without being limited to this, it is possible to use a superlattice obtained by alternately laminating an InP layer 2a and an $Al_xGa_yIn_{1-x-y}As$ layer ($0.16 \leq x \leq 0.48$, $0 \leq y \leq 0.31$) as the buffer layer 2.

The buffer layer 2 need not necessarily be undoped but may also be doped with a transition metal such as Fe or Ru as a semi-insulating dopant. This further improves the effect of suppressing a current leakage. However, when it is difficult to dope the buffer layer 2 with a transition metal due to constraints of a growth apparatus, similar effects can be expected by adjusting a temperature of the $Al_xGa_yIn_{1-x-y}As$ layer of the buffer layer 2 at the time of growth and the flow rate of the V group and thereby taking in oxygen. In that case, the oxygen concentration in the $Al_xGa_yIn_{1-x-y}As$ layer of the buffer layer 2 is set to $1E+15$ $cm^{-3}$ or more and $1E+20$ $cm^{-3}$ or less.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2015-150723, filed on Jul. 30, 2015 including specification, claims, drawings and summary, on which the Convention priority of the present application is based, is incorporated herein by reference in its entirety.

What is claimed is:

1. A semiconductor light-receiving device comprising:
a semi-insulating substrate; and
a buffer layer, a p-type contact layer, a light absorption layer, a p-type field alleviating layer, an avalanche multiplication layer, an n-type field alleviating layer and an n-type contact layer laminated in order on the semi-insulating substrate,
wherein the buffer layer includes a superlattice obtained by alternately laminating an InP layer and an $Al_xGa_yIn_{1-x-y}As$ layer ($0.16 \leq x \leq 0.48$, $0 \leq y \leq 0.31$), the buffer layer forms a barrier to electrons, the buffer layer does not absorb light of a wavelength band absorbed by the light absorption layer, the buffer layer is undoped, and the buffer layer is not a Distributed Bragg Reflector (DBR) structure.

2. The semiconductor light-receiving device of claim 1, wherein the light absorption layer includes first and second light absorption layers formed separate from each other on the p-type contact layer,
the p-type field alleviating layer includes first and second p-type field alleviating layers formed on the first and second light absorption layers respectively,
the avalanche multiplication layer includes first and second avalanche multiplication layers formed on the first and second light p-type field alleviating layers respectively,
the n-type field alleviating layer includes first and second n-type field alleviating layers formed on the first and second avalanche multiplication layers respectively,
the n-type contact layer includes first and second n-type contact layers formed on the first and second n-type field alleviating layers respectively,
the first light absorption layer, the first p-type field alleviating layer, the first avalanche multiplication layer, the first n-type field alleviating layer and the first n-type contact layer constitute a first avalanche photodiode, and
the second light absorption layer, the second p-type field alleviating layer, the second avalanche multiplication layer, the second n-type field alleviating layer and the second n-type contact layer constitute a second avalanche photodiode.

* * * * *